United States Patent
Huseth et al.

(10) Patent No.: US 8,046,180 B2
(45) Date of Patent: Oct. 25, 2011

(54) MODEL-BASED DETERMINATION OF POWER SOURCE REPLACEMENT IN WIRELESS AND OTHER DEVICES

(75) Inventors: Steve D. Huseth, Plymouth, MN (US); Andrew G. Berezowski, Wallingford, CT (US)

(73) Assignee: Honeywell International Inc., Morristown, NJ (US)

( * ) Notice: Subject to any disclaimer, the term of this patent is extended or adjusted under 35 U.S.C. 154(b) by 268 days.

(21) Appl. No.: 11/827,795

(22) Filed: Jul. 13, 2007

(65) Prior Publication Data

US 2009/0018785 A1    Jan. 15, 2009

(51) Int. Cl.
*G01R 29/24* (2006.01)
*G01R 19/165* (2006.01)
*G01R 11/02* (2006.01)
*G01R 17/00* (2006.01)

(52) U.S. Cl. ............. 702/60; 702/63; 702/79; 702/80

(58) Field of Classification Search ............ 702/42, 702/63, 64, 73, 178, 182, 183, 188; 320/132; 324/426; 607/29
See application file for complete search history.

(56) References Cited

U.S. PATENT DOCUMENTS

| | | | |
|---|---|---|---|
| 6,545,448 B1 * | 4/2003 | Stanley et al. | 320/132 |
| 6,760,625 B1 * | 7/2004 | Kroll | 607/29 |
| 7,061,246 B2 * | 6/2006 | Dougherty et al. | 324/426 |
| 7,521,935 B2 * | 4/2009 | Uchida | 324/426 |
| 7,593,822 B2 * | 9/2009 | Stewart | 702/63 |

* cited by examiner

*Primary Examiner* — Michael Nghiem
*Assistant Examiner* — Felix Suarez
(74) *Attorney, Agent, or Firm* — Munck Carter, LLP

(57) ABSTRACT

A model-based system and method for analyzing power source performance and optimizing operational costs are provided. Data from the power source (such as a battery) and/or a device associated with the power source is analyzed and processed to predict an operating life of the power source. This could allow, for example, a power source replacement schedule to be generated for the device. If the analysis indicates that abnormal conditions exist or that any user-defined alerts are warranted, a message could also be sent to an operator terminal. The system and method may continue to monitor the device and thus provide real-time data. The data may also be stored in memory, collected over time, and analyzed or used in various ways. The system and method thus provide a cost effective and reliable analysis of power source performance and any associated operational and replacement costs.

21 Claims, 3 Drawing Sheets

MODEL-BASED DETERMINATION OF POWER SOURCE REPLACEMENT IN WIRELESS AND OTHER DEVICES

TECHNICAL FIELD

This disclosure relates generally to device analysis and power management and more specifically to model-based determination of power source replacement in wireless and other devices.

BACKGROUND

Processing facilities are often managed using process control systems. Example processing facilities include chemical, pharmaceutical, paper, and petrochemical production plants. Among other operations, process control systems typically interact with and control industrial equipment in the processing facilities, such as equipment used to produce chemical, pharmaceutical, paper, or petrochemical products.

Process control systems routinely include wireless components, such as wireless sensor networks that provide measurement data to process controllers. A typical wireless sensor network often includes battery-powered sensor devices and other battery-powered devices.

A significant obstacle to the adoption of wireless devices in process control systems and other systems is the potential failure of the wireless devices due to loss of battery power. This is often a result of maintenance personnel failing to service the wireless devices properly, where proper maintenance includes timely battery replacement. This problem is exacerbated by the fact that battery power in wireless devices is often not consumed at the same rate by all wireless devices in a system. This could be due to different usage patterns of the devices or other factors. For example, wireless devices requiring frequent communication typically also require more-frequent battery replacement. However, the proper battery replacement schedule for a wireless device often cannot be determined when the wireless device is installed.

A number of techniques have been used to attempt to determine the proper battery replacement schedule for wireless devices after installation. Some techniques have used formulas based on an average expected transmitter behavior of a wireless device and an average shelf life of a battery. Other techniques have relied on indicators showing low battery power based on the output voltage of the battery. Each of these techniques has its shortcomings, however, which can result in premature or overdue replacement of batteries in wireless devices.

SUMMARY

This disclosure provides for model-based determination of power source replacement in wireless and other devices, such as wireless sensors.

In a first embodiment, a system includes a power source associated with a device. The system also includes a processing module configured to process data associated with the power source and the device to predict an operating life of the power source.

In particular embodiments, the device represents a wireless sensor, and the power source represents a battery.

In other particular embodiments, the operating life of the power source accounts for power usage associated with periodic operation of the device.

In yet other particular embodiments, the data may include an operating condition of the power source, an operating condition of the device, a safety rating of the power source, a safety rating of the device, an industry standard, and a user-defined threshold.

In a second embodiment, a method includes receiving data associated with a power source and a device associated with the power source. The method also includes predicting an operating life of the power source from the received data.

In a third embodiment, a computer program is embodied on a computer readable medium. The computer program includes computer readable program code for correlating data associated with a power source and a device associated with the power source. The computer program also includes computer readable program code for predicting an operating life of the power source using the correlated data.

Other technical features may be readily apparent to one skilled in the art from the following figures, descriptions, and claims.

BRIEF DESCRIPTION OF THE DRAWINGS

For a more complete understanding of this disclosure, reference is now made to the following description, taken in conjunction with the accompanying drawings, in which.

DETAILED DESCRIPTION

Figure 1:
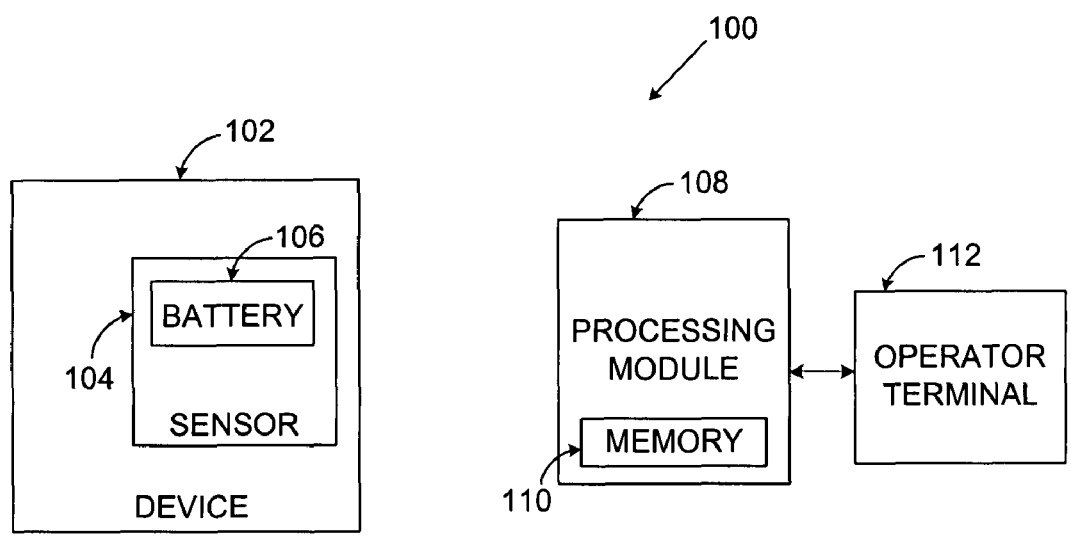
FIG. 1 illustrates an example battery performance and life analysis system according to one embodiment of this disclosure.

FIG. 1 illustrates an example battery performance and life analysis system 100 according to one embodiment of this disclosure. The embodiment of the system 100 shown in FIG. 1 is for illustration only. Other embodiments of the system 100 may be used without departing from the scope of this disclosure.

In this example, the system 100 includes a device 102 that incorporates, is coupled to, or is otherwise associated with one or more sensors 104. Each sensor 104 could perform a wide variety of functions, such as monitoring the activities and/or performance characteristics of the device 102. The sensor 104 could include any suitable structure for monitoring the device 102 or other characteristics of a system, such as a wired sensor, wireless sensor, transducer, or direct-indicating sensor. As particular examples, the sensor 104 could include an electrical sensor, mechanical sensor, pressure sensor, resistance sensor, current sensor, voltage sensor, power sensor, magnetic sensor, gas flow sensor, fluid flow sensor, temperature sensor, humidity sensor, chemical sensor, light sensor, sound sensor, motion sensor, position sensor, orientation sensor, radiation detector, infrared detector, ultrasound detector, metal detector, or other suitable sensor.

The sensor 104 is powered by a local power source, which in this example includes a battery 106. The device 102 itself could also be powered in part or in whole by the battery 106. The battery 106 could include any suitable structure for powering one or more sensors 104, devices 102, or other suitable components or parts thereof. The battery 106 could be a primary cell (such as a non-rechargeable cell) or a secondary cell (such as a rechargeable cell). As particular examples, the battery 106 could include a wet cell, dry cell, electrochemical cell, galvanic cell, Edison cell, mercury cell, copper-zinc, alkaline, nickel cadmium, nickel metal hydride, lithium, lithium ion, aluminum, rechargeable energy source, or other suitable energy source. The battery 106 could also be used in conjunction with fixed power sources or power scavenging sources, such as solar or wind powered mechanisms. While described as using a battery 106 in the device 102 to power the sensor 104, any other suitable power source could be used in the sensor 104 or device 102.

Data collected from the device 102, such as sensor readings from the sensor 104, is analyzed in a processing module 108. As described in more detail below, the data collected from the device 102 could include data related to the usage of the battery 106 in the device 102. The processing module 108 may represent any suitable hardware, software, firmware, or combination therefore (such as a processor, controller, or computer program) capable of analyzing data related to usage of a battery or other power source. The processing module 108 may be external to the device 102 as shown in FIG. 1 or may be part of the device 102.

Data may be transferred from the device 102 to the processing module 108 in any suitable manner, including over wired or wireless connections. The data could also be stored on a storage medium or memory 110, such as a disk or removable memory device, and then transferred to the processing module 108. The memory 110 may be removably or permanently part of the processing module 108 as shown in FIG. 1 or may be located external to the processing module 108. In addition, the data may be transferred from the sensor 104 to a processor or controller associated with the device 102 before being provided to and analyzed in the processing module 108.

The analysis performed by the processing module 108 may include determining the battery life of the battery 106. The processing module 108 could also provide a replacement schedule for the battery 106. For example, the analysis performed by the processing module 108 could account for the current use, functionality, and environment of the battery 106, the sensor 104, and/or the device 102. The analysis could also account for any past differences in power consumption based on the past use, functionality, and environment of the battery 106, the sensor 104, and/or the device 102. As a particular example, the processing module 108 could monitor the power consumed by the sensor 104 during different modes of operation. As another example, the processing module 108 could compare the operation and down-time of the device 102 and correlate that information with the power consumption of the sensor 104. As still another example, the processing module 108 could correlate data using different sample rates or other data manipulating factors. Some or all of these techniques could be used by the processing module 108 to predict the operational life and replacement time of the battery 106.

An operator terminal 112 may represent any suitable terminal, monitor, or apparatus suitable for monitoring or displaying data associated with the system 100. The operator terminal 112 may be located external to the device 102 and the processing module 108 as shown in FIG. 1 or may be part of the device 102, the processing module 108, or both. Among other things, the operator terminal 112 could receive warnings or alerts generated by the processing module 108.

Although FIG. 1 illustrates one example of a battery performance and life analysis system 100, various changes may be made to FIG. 1. For example, the device 102 could include any number of sensors 104 and batteries 106 (or other power sources), and the sensors and batteries could have any suitable configuration. Also, the processing module 108 could be used to predict a preferred or optimal time frame for power source replacement in a single device 102 or multiple devices 102. In addition, the processing module 108 could be separate from all of the devices 102 or integrated into one or more of the devices 102.

Figure 2:
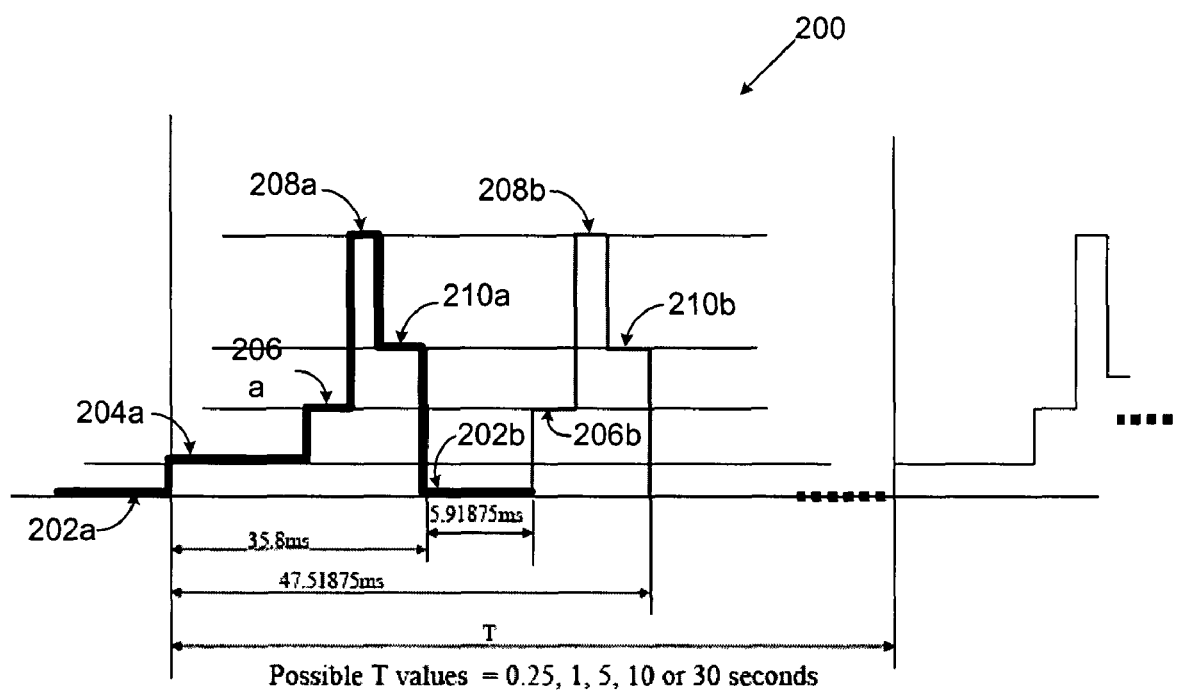
FIG. 2 illustrates an example timing diagram showing a periodic operation of a sensor according to one embodiment of this disclosure.

FIG. 2 illustrates an example timing diagram 200 showing a periodic operation of a sensor according to one embodiment of this disclosure. The timing diagram 200 could be used by the processing module 108 as a power consumption model or profile for a typical sensor or type of sensor or for a particular sensor or type of sensor. The timing diagram 200 of FIG. 2 is for illustration only. Other embodiments of the timing diagram 200 (and its associated model) may be used without departing from the scope of this disclosure.

In this example, the timing diagram 200 illustrates the sensor 104 operating in five general operating modes. Other embodiments supporting model operations of this or other wireless devices in any other or additional modes could also be used.

In the example shown in FIG. 2, the timing diagram 200 generally illustrates the differences in power consumption when the sensor 104 is in a sleep mode state 202a, a data processing state 204a, a ready mode state 206a, a transmitting state 208a, and a receiving state 210a. When the sensor 104 is operating in the sleep mode state 202a, the sensor 104 could consume relatively little power and may continue in the sleep mode state 202a until the sensor 104 switches to the data processing state 204a to process data (such as sensor data to be transmitted).

From the data processing state 204a, the sensor 104 enters the ready mode state 206a and then the transmitting state 208a. While operating in the transmitting state 208a, the sensor 104 transmits data and therefore consumes more power than when operating in the ready mode state 206a or the data processing state 204a. After data transmission is complete, the sensor 104 operates in the receiving mode state 208a, during which time the sensor 104 waits to receive any data from an external source.

After the receiving state 210a, the sensor 104 could repeat at least part of the operating mode cycle, such as by entering a sleep mode state 202b, a ready mode state 206b, a transmitting state 208b, and a receiving state 210b again. This could be repeated for a predetermined time (T). For example, the time (T) could be equal to 0.25, 1, 5, 10 or 30 seconds depending on the specification or use of the sensor 104. The entire operating mode cycle could then be repeated for another interval of time T.

In particular embodiments, the sensor 104 could draw power in the range of about 19.8 μA times the voltage rating of the battery 106 in the sleep mode state 202a. Thereafter, the sensor 104 could enter the data processing state 204a for about 30 ms and draw power in the range of about 4.0168 mA times the voltage rating of the battery 106. The sensor 104 could then enter the ready mode state 206a for about 1.85 ms and draw power in the range of about 11.389459 mA times the voltage rating of the battery 106. Following the ready mode state 206a, the sensor 104 could enter the transmitting state 208a for about 1.93 ms and, during that time, draw power in the range of about 139.01 mA times the voltage rating of the battery 106. Finally, the sensor 104 could enter the receiving state 210a for about 2.02 ms and draw power in the range of about 38.069406 mA times the voltage rating of the battery 106. Following the receiving state 210a, the sensor 104 could return to the sleep mode state 202b and remain in that state for about 5.91875 ms. Accordingly, in the example shown in FIG. 2, the time taken for the sensor 104 to operate from the initial sleep mode state 202a to the second sleep mode state 202b is approximately 35.8 ms. The time taken for the sensor 104 to operate from the initial sleep mode state 202a to a third sleep mode state (following the receiving state 210b) is approximately 47.51875 ms. Since the timing diagram 200 provides an example model for the operation of a wireless sensor or other device, this model could be used by the processing module 108 to predict power consumption by a wireless device that operates according to this type of schedule.

Although FIG. 2 illustrates one example of a timing diagram 200 showing a periodic operation of a sensor, various changes may be made to FIG. 2. For example, other wireless devices could operate using other or additional states and sequences of states. Also, the same or similar type of model could be used with devices having any type of power supply and is not limited to use with just wireless devices using batteries.

Figure 3:
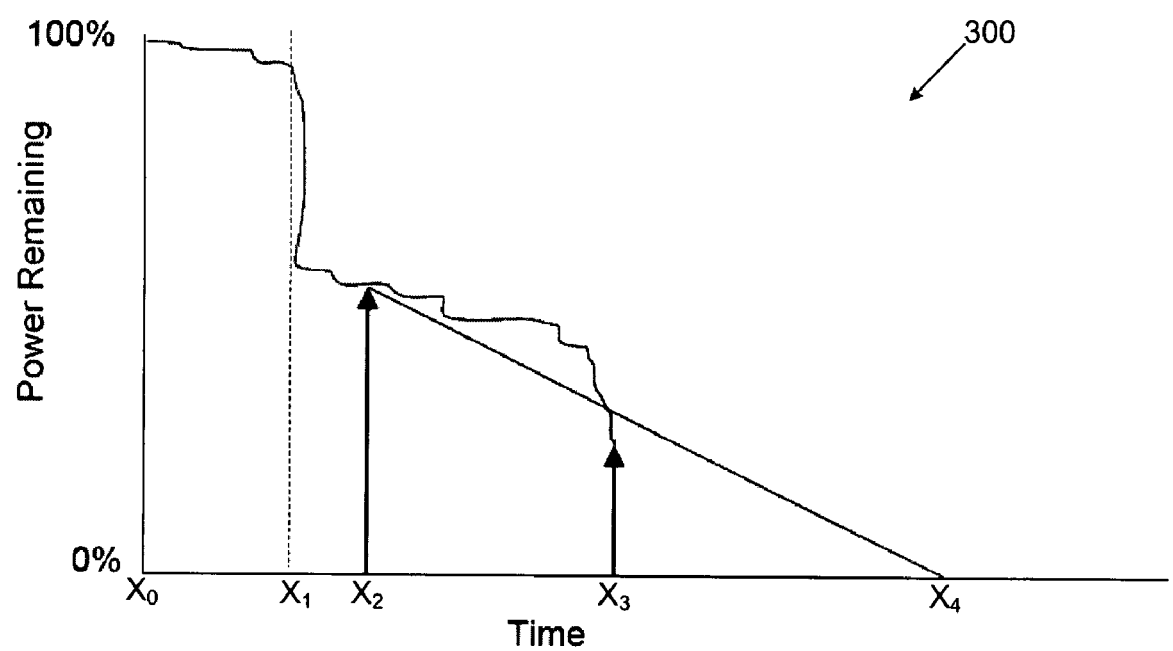
FIG. 3 illustrates an example real-time power consumption profile of a battery according to one embodiment of this disclosure.

FIG. 3 illustrates an example real-time power consumption profile 300 of a battery according to one embodiment of this disclosure. The battery consumption profile 300 shown in FIG. 3 is for illustration only. Other embodiments of the battery consumption profile 300 may be used without departing from the scope of this disclosure. Also, while described with respect to the battery 106 in the device 102 of FIG. 1, the battery consumption profile 300 could be used with any suitable power source in any suitable device.

In this example, the power consumption profile 300 illustrates an example relationship or profile between the power remaining in the battery 106 of the device 102 as a function of time. In other words, the battery consumption profile 300 identifies the actual and/or predicted power consumption associated with the battery 106 in the device 102.

The battery consumption profile 300 in FIG. 3 may be used by the processing module 108 to analyze characteristics, variables, or patterns associated with the real-time power consumption or performance of the battery 106. The power consumption of the battery 106 generally changes as a function of power consumed by an associated device 102 that draws power from it. In this example, the battery consumption profile 300 illustrates that between the time when the battery 106 is first installed at time $X_0$ and when the associated device 102 begins operating at about time $X_1$, the power remaining in the battery 106 generally monotonically decreases. At or about time $X_1$, the power consumed by the battery 106 dramatically decreases to about 60%, and then the power remaining in the battery somewhat levels off at about time $X_2$. The power consumed by the battery 106 between times $X_2$ and $X_3$ steadily decreases if the associated device 102 does not draw a relatively large amount of power. Similarly, if the associated device 102 draws a relatively large amount of power (such as when the sensor 104 engages in frequent operations that draw relatively more power), then the power consumed by the battery 106 between times $X_2$ and $X_3$ could decrease rapidly.

In addition, between times $X_3$ and $X_4$, battery consumption profile 300 illustrates a model of the real-time power consumption as a function of time. At some point around time $X_4$, the power remaining in the battery 106 is almost equal to or equal to 0%. At or about time $X_4$, the battery 106 should be replaced. In other embodiments, replacement of the battery 106 may be required before the power remaining in the battery 106 is at or near 0%, such as when the power remaining in the battery 106 reaches an unsafe level.

The battery consumption profile 300 between times $X_3$ and $X_4$ could be modeled using straight-line methods that include data points between times $X_2$ and $X_3$ as shown in FIG. 3. In other embodiments, usage history of the battery 106 could be used to model the power consumption between times $X_3$ and $X_4$. In still other embodiments, the power consumption between times $X_3$ and $X_4$ could be modeled using curve fitting methods such as logarithmic or exponential methods. In yet other embodiments, the power consumption between times $X_3$ and $X_4$ may be modeled using available data from the battery 106, the associated device 102 and/or other similarly situated batteries or devices.

The processing module 108 could also monitor the number of occurrences and time spent by the sensor 104 in each of the operating states (such as those described above with respect to FIG. 2). This could be taken into account along with the power consumption of the battery 104 (described above with respect to FIG. 3) to determine a lifetime of the battery 106 and/or a recommended battery replacement schedule. In some embodiments, the processing module 108 performs the monitoring and collection of the associated data in real-time.

As particular examples, the processing module 108 could correlate the collected data with a safety rating of the battery 106, a safety rating of the sensor 104, and/or a safety rating of the device 102. The processing module 108 could also correlate the collected data with desired operating conditions of the battery 106, desired operating conditions of the sensor 104, and/or desired operating conditions of the device 102. As other examples, the processing module 108 could correlate the collected data with operational costs associated with the battery 106, the sensor 104, and/or the device 102. As still other examples, the processing module 108 could correlate the collected data with user-defined thresholds, variables, and/or industry parameters governing the battery 106, the sensor 104, and/or the device 102. Any or all of this information can be used by the processing module 108 to, for example, determine when the battery 106 should be replaced, such as by predicting when the battery 106 may enter an unstable or unsafe stage of operation.

After correlating and processing the data, the processing module 108 may determine whether any abnormal conditions exist or any user-defined alerts are warranted. This could include, for example, issuing a user-defined alert when the predicted lifetime of the battery 106 drops below a user-defined threshold. If any abnormal condition exists or user-defined alerts are warranted (such as an impending battery failure, unexpected change in battery life, or generation of a replacement schedule), the processing module 108 sends the pertinent message or alert to the operator terminal 112.

After sending a pertinent message or alert, the processing module 108 may continue to analyze data from the battery 106 and/or the sensor 104. Optionally, an operator using the operator terminal 112 can request certain data or data reports from the processing module 108. For example, the operator using the operator terminal 112 may request a certain performance characteristic, battery life prediction data, performance report, or cost analysis report from the processing module 108. The requested data, in turn, may be displayed in graphical, tabular, or other suitable form to the operator terminal 112 for the operator's review. Thus, the system 100 may continuously analyze the performance of the battery 106, the sensor 104, and/or the device 102 and provide real-time data.

In addition, the data used, collected or generated by the processing module 108 may be stored in the memory 110. The stored data may also be analyzed over time to produce comprehensive battery performance reports showing, for example, how the battery 106 and/or sensor 104 performs in different operating environments. Accordingly, the system 100 provides a cost effective and reliable technique for real-time analysis and long-term battery performance studies and comprehensive battery replacement scheduling.

Data used, correlated, or generated in the processing module 108 may also be stored in order to conduct comparisons with other batteries used in similar sensors. The data could also be used to provide predictive performance results based on historical data and/or projections made by the system 100.

The processing module 108 could further compare current operating costs and calculate an optimal maintenance cycle for the battery 106 based on operating costs, maintenance labor, and costs of having the sensor 104 and/or device 102 out of service. The processing module 108 could then calculate the optimal maintenance schedule or cycle for the battery 106.

In addition, the processing module 108 could correlate data from other replacement predicting algorithms and/or systems. For example, the processing module 108 could be used in conjunction with battery life prediction formulas based on an average expected transmitter behavior of a device 102 and an average shelf life of a particular kind of battery or groups of batteries. As another example, the processing module 108 could be used in conjunction with information from detectors monitoring for low battery power based on the battery's output voltage. As still another example, the processing module 108 could be used in conjunction with systems that monitor the calendar time and/or the operation times of the sensor 104 and/or the device 102 and correlates the expected battery use for a particular day, time of day, or other specified time period.

Accordingly, the system 100 provides a cost effective, reliable, and model-based technique for real-time analysis and battery life and performance studies. The system 100 could be implemented in any suitable manner. For example, the system 100 may be implemented as part of or in conjunction with a controller or other existing monitoring system. As another example, the system 100 may be implemented as part of a computer program embodied on a computer readable medium.

Although FIG. 3 illustrates one example of a real-time power consumption profile 300 of a battery, various changes may be made to FIG. 3. For example, other or additional wireless devices could operate and consume power in any other suitable manner.

Figure 4:
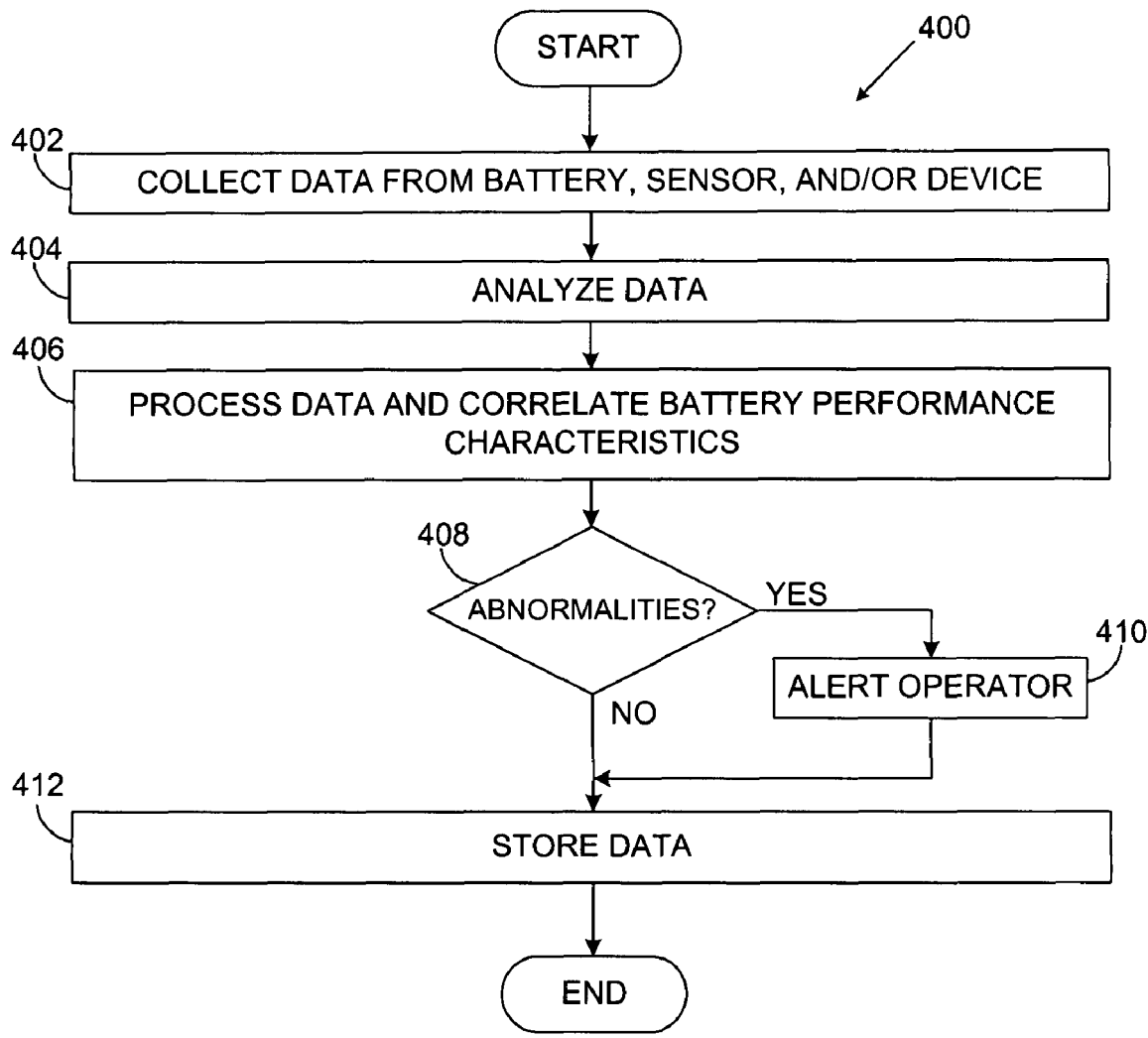
FIG. 4 illustrates an example method for analyzing battery performance and life according to one embodiment of this disclosure.

FIG. 4 illustrates an example method 400 for analyzing battery performance and life according to one embodiment of this disclosure. For ease of explanation, the method 400 is described as being used in conjunction with the system 100 of FIG. 1. The method 400, however, may be used with any other suitable system. Also, other embodiments of the method 400 may be used without departing from the scope of this disclosure.

Data from a battery, a series of batteries, a sensor, a series of sensors, a device, or a series of devices is collected at step 402. This could include, for example, collecting data from the battery 106, the sensor 104, and the device 102.

The collected data is analyzed at step 404. This could include, for example, using the processing module 108. The analysis performed by the processing module 108 may include identifying and/or recognizing battery performance, sensor performance, device performance, operating costs, battery characteristics, sensor characteristics, device characteristics, variables, or patterns associated with the battery performance, such as the operation of the sensor 104 or the device 102.

The analyzed data is processed and correlated with battery performance characteristics in step 406. The processing and correlation could determine whether the device 102 will remain in operation over a specified time period, predict a preferred time period in which the battery 106 should require replacement and/or predict an optimal maintenance schedule or cycle to replace the battery 106.

A determination is made as to whether any abnormal conditions or any user-defined alerts are warranted at step 408. The user-defined alerts may include warning an operator that the battery 104 may be approaching a particular threshold or potentially unsafe condition.

If any abnormal condition exists or a user-defined alert is indeed warranted, a pertinent message or alert is sent to an operator at step 410. Other steps could also be taken, such as sending a warning, shut-down message, or lock-down order to the device 102. As another example, the processing module 108 may send a warning, shut-down message, or lock-down order to a processor, controller, multi-variable controller, or optimizer associated with the battery 106, the sensor 104, and/or the device 102.

Various data can be stored at step 412. This could include, for example, storing the data collected in step 402, the analysis results from step 404, and/or the correlated data found in step 406.

At this point, the method 400 ends, and any suitable action can occur. For example, the method 400 could be repeated by returning to step 402 to collect more data from the battery 106, the sensor 104, and/or the device 102 if required. Thus, the method 400 can continuously analyze the performance of the battery 106 and identify any abnormal conditions by analyzing new data or sets of data and providing real-time data accordingly. In addition, the method 400 can continuously analyze the performance of the battery 106 and provide real-time data related to the projected life of the battery 106 accordingly.

Although FIG. 4 illustrates one example of a method 400 for analyzing battery performance and life, various changes could be made to FIG. 4. For example, while shown as a series of steps, various steps in FIG. 4 could overlap, occur in parallel, or occur multiple times.

In some embodiments, various functions described above are implemented or supported by a computer program that is formed from a computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory.

It may be advantageous to set forth definitions of certain words and phrases used throughout this patent document. The term "couple" and its derivatives refer to any direct or indirect communication between two or more elements, whether or not those elements are in physical contact with one another. The terms "application" and "program" refer to one or more computer programs, software components, sets of instructions, procedures, functions, objects, classes, instances, related data, or a portion thereof adapted for implementation in a suitable computer code (including source code, object code, or executable code). The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. The term "controller" means any device, system, or part thereof that controls at least one operation. A controller may be implemented in hardware, firmware, software, or some combination of at least two of the same. The functionality associated with any particular controller may be centralized or distributed, whether locally or remotely.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A system comprising:
a processing module configured to process data associated with a device and a power source associated with the device to predict an operating life of the power source by modeling real-time power consumption of the device using at least one of: a logarithmic curve fitting method and an exponential curve fitting method;
wherein the data associated with the device and the power source comprises historical data; and
wherein the processing module is configured to model the real-time power consumption of the device by applying at least one of the logarithmic curve fitting method and the exponential curve fitting method to the historical data to predict operating life of the power source.

2. The system of claim 1, wherein the device comprises a wireless sensor, and the power source comprises a battery.

3. The system of claim 1, wherein the processing module is configured to predict the operating life of the power source by estimating the power consumed by the device in each of a plurality of different modes of operation during each of multiple repeating sequences of the different modes.

4. The system of claim 1, wherein the data comprises at least one of: an operating condition of the power source, an operating condition of the device, a safety rating of the power source, a safety rating of the device, an industry standard, and a user-defined threshold.

5. The system of claim 1, wherein:
the device comprises a sensor; and
the data comprises at least one of: an operational cost of the power source, an operational cost of the sensor, and an operational cost of the device.

6. The system of claim 1, wherein the processing module is further configured to predict a replacement schedule for the power source.

7. The system of claim 6, wherein the replacement schedule includes a preferred time frame for replacing the power source.

8. The system of claim 1, wherein the processing module is further configured to output a warning message to an operator terminal when the data indicates that an abnormal condition exists or that a user-defined level is exceeded.

9. The system of claim 1, wherein the data comprises real-time data.

10. The system of claim 1 further comprising:
a memory configured to store data associated with performance of the power source.

11. The system of claim 3, wherein:
each of the multiple repeating sequences of the different modes comprises a sleep mode, a data processing mode, a ready mode, a transmitting mode, and a receiving mode;
the power consumed by the device in each mode is different; and
the processing module is configured to predict the operating life of the power source by estimating the power consumed by the device in each of the five modes of operation during an estimated number of sequences that occur at a specified periodic interval.

12. A method comprising:
receiving data associated with a power source and with a device associated with the power source; and
predicting an operating life of the power source from the received data by modeling real-time power consumption of the device using at least one of: a logarithmic curve fitting method and an exponential curve fitting method;
wherein the data associated with the power source and the device comprises historical data and
wherein modeling the real-time power consumption of the device comprises applying at least one of the logarithmic curve fitting method and the exponential curve fitting method to the historical data to predict the operating life of the power source.

13. The method of claim 12, wherein predicting the operating life of the power source comprises estimating the power consumed by the device in each of a plurality of different modes of operation during each of multiple repeating sequences of the different modes.

14. The method of claim 12, wherein predicting the operating life of the power source comprises accounting for at least one of: an operating condition of the power source, an operating condition of the device, a safety rating of the power source, a safety rating of the device, an industry standard, and a user-defined threshold.

15. The method of claim 12, wherein:
the device comprises a sensor; and
predicting the operating life of the power source comprises accounting for at least one of: an operational cost of the power source, an operational cost of the wireless sensor, and an operational cost of the device.

16. The method of claim 12, further comprising:
providing a replacement schedule for the power source.

17. The method of claim 16, wherein the replacement schedule includes a preferred time frame for replacing the power source.

18. The method of claim 12, further comprising:
providing a warning message to an operator terminal when the data indicates that an abnormal condition exists or that a user-defined level is exceeded.

19. The method of claim 12, wherein the data comprises real-time data.

20. A non-transitory computer readable medium embodying a computer program, the computer program comprising computer readable program code for:
correlating data associated with a power source and with a device associated with the power source; and
predicting an operating life of the power source using the correlated data by modeling real-time power consumption of the device using at least one of: a logarithmic curve fitting method and an exponential curve fitting method;
wherein the data associated with the power source and the device comprises historical data; and
wherein the computer readable program code for modeling the real-time power consumption of the device comprises computer readable program code for applying at least one of the logarithmic curve fitting method and the exponential curve fitting method to the historical data to predict the operating life of the power source.

21. The computer readable medium of claim 20, further comprising computer readable program code for:
providing a replacement schedule for the power source.

* * * * *